United States Patent
Ozeki et al.

(10) Patent No.: US 7,692,221 B2
(45) Date of Patent: Apr. 6, 2010

(54) SEMICONDUCTOR DEVICE HAVING IGBT ELEMENT

(75) Inventors: Yoshihiko Ozeki, Nukata-gun (JP); Yukio Tsuzuki, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 395 days.

(21) Appl. No.: 11/714,201

(22) Filed: Mar. 6, 2007

(65) Prior Publication Data

US 2007/0215898 A1  Sep. 20, 2007

(30) Foreign Application Priority Data

Mar. 14, 2006  (JP) .............. 2006-069746

(51) Int. Cl.
*H01L 27/088* (2006.01)
(52) U.S. Cl. .............. 257/262; 257/E27.06
(58) Field of Classification Search .......... 257/127, 257/170, 409, 484, 490, 495, 605, 262, E27.06
See application file for complete search history.

(56) References Cited

U.S. PATENT DOCUMENTS 6,737,705 B2   5/2004  Momota et al.

2005/0032280 A1*  2/2005  Yanagisawa ............ 438/138
2007/0114570 A1*  5/2007  Yamaguchi et al. ........ 257/197

FOREIGN PATENT DOCUMENTS

| EP | 0837508 | 4/1998 |
|----|---------|--------|
| EP | 1032047 | 8/2000 |
| JP | A-10-178174 | 6/1998 |
| JP | A-11-266010 | 9/1999 |
| JP | A-2000-307116 | 2/2000 |

* cited by examiner

*Primary Examiner*—Jerome Jackson, Jr.
*Assistant Examiner*—Dale Page
(74) *Attorney, Agent, or Firm*—Posz Law Group, PLC

(57) ABSTRACT

A semiconductor device having an insulated gate bipolar transistor (IGBT) is formed on a semiconductor substrate. A base region and an emitter are formed on a first surface of the substrate while a collector layer is formed on second surface of the substrate. A region having a low breakdown voltage is formed on the first surface around the IGBT, and a carrier collecting region is formed in the vicinity of the region having the low breakdown voltage. The IGBT is prevented from being broken down due to an avalanche phenomenon, because the breakdown occurs in the region having the low breakdown voltage, and carriers of the breakdown current are collected through the carrier collecting region. The breakdown of the IGBT is further effectively prevented by forming a guard ring for suppressing electric field concentration around the region having the low breakdown voltage.

14 Claims, 3 Drawing Sheets

SEMICONDUCTOR DEVICE HAVING IGBT ELEMENT

CROSS-REFERENCE TO RELATED APPLICATION

This application is based upon and claims benefit of priority of Japanese Patent Application No. 2006-69746 filed on Mar. 14, 2006, the content of which is incorporated herein by reference.

BACKGROUND OF THE INVENTION

1. Field of the Invention

The present invention relates to a semiconductor device that includes an Insulated Gate Bipolar Transistor (referred to as IGBT) having a trench structure.

2. Description of Related Art

An example of the IGBT having a trench structure is disclosed in JP-A-2001-308327. In this type of IGBT, a channel density can be made larger than that in a so-called IGBT having a planar structure. In other words, a saturated voltage between an emitter and a collector (ON-voltage) can be made lower in the IGBT having a trench structure.

It has been generally known that an avalanche phenomenon tends to be caused in the IGBT at a turning-off under a high current density. If the avalanche phenomenon occurs, the IGBT may be broken by a breakdown current. Especially in the IGBT having a trench structure, there is a tendency that a breakdown current concentrates at a bottom surface of a gate trench due to concentration of electric field at the bottom surface of the gate trench, and a gate insulating film is broken. This is confirmed also by inventors of the present invention.

SUMMARY OF THE INVENTION

The present invention has been made in view of the above-mentioned problem, and an object of the present invention is to provide an improved semiconductor device having an IGBT, in which breakdown of the IGBT due to a breakdown current is prevented.

An insulated gate bipolar transistor (IGBT) element is formed on a first surface of a substrate made of an N-type semiconductor, and a collector layer of the IGBT, made of a P-type semiconductor, is formed on the second surface of the substrate. A base region of the IGBT, made of a P-type semiconductor, is formed on the first surface of the substrate. Gate trenches serving as a gate electrode of the IGBT are formed through the base region. A region having a breakdown voltage lower than that of the IGBT is formed around the IGBT element, and a carrier collecting region that collects carries (holes) of breakdown current is formed in the vicinity of the region having the low breakdown voltage.

A field-stop layer (FS layer), made of an N-type semiconductor, may be formed in contact with the collector layer formed on the second surface of the substrate. An electric field concentration suppressing region, made of a P-type semiconductor may be formed as a guard ring around the region having the low breakdown voltage. The region having the low breakdown voltage may be made as a dummy trench formed on the first surface of the substrate. A well region, made of a P-type semiconductor, may be formed in place of the dummy trench. The well region is made deeper than the base region to effectively collect carriers of breakdown current.

In place of the region having the low breakdown voltage and the carrier collecting region, a Zener diode having a breakdown voltage lower than that of the IGBT may be connected between the collector and the emitter of the IGBT. The Zener diode may be formed as part of wiring of the IGBT, or it may be separately formed. The substrate may be made of a P-type semiconductor (instead of the N-type), and in this case, the base region and other regions are made of an N-type semiconductor.

The IGBT element is prevented from being broken down, because the breakdown due to an avalanche phenomenon occurs in the region having the low breakdown voltage, and carriers of the breakdown current are collected by the carrier collecting region formed in the vicinity of the region having the low breakdown voltage. The breakdown of the IGBT is further effectively prevented by forming the electric field concentration suppressing region as a guard ring around the region having the low breakdown voltage.

Other objects and features of the present invention will become more readily apparent from a better understanding of the preferred embodiments described below with reference to the following drawings.

DETAILED DESCRIPTION OF THE PREFERRED EMBODIMENTS

Figure 1:
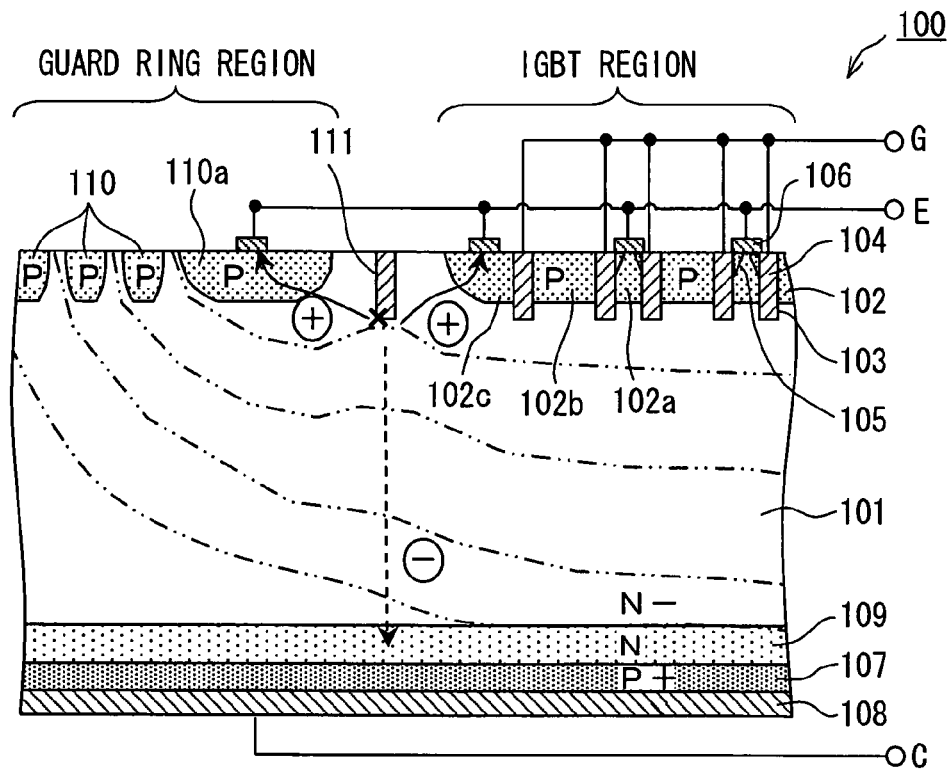
FIG. 1 is a cross-sectional view showing a semiconductor device having an IGBT as a first embodiment of the present invention.
Figure 2:
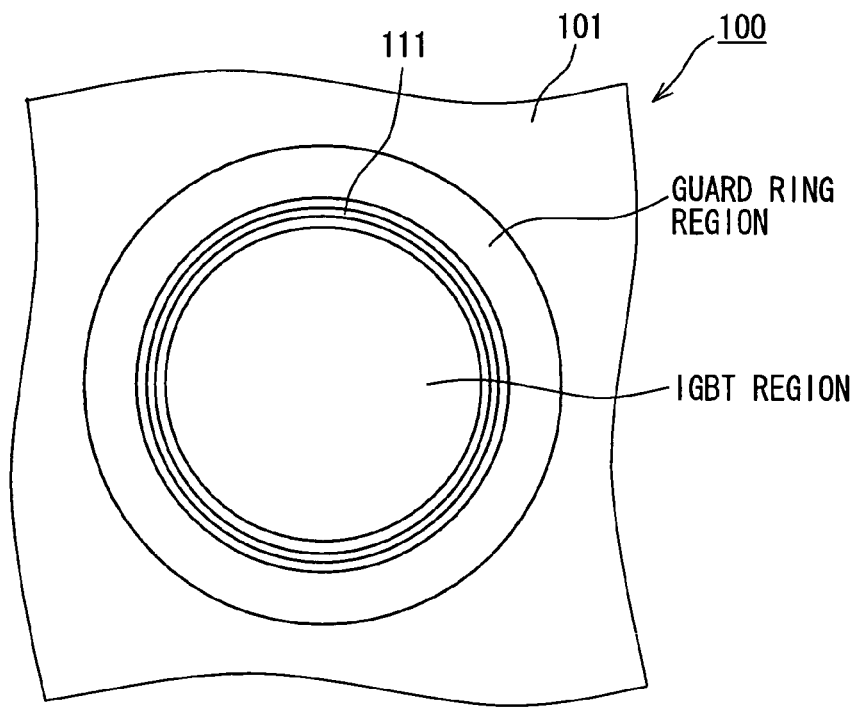
FIG. 2 is a plan view partially showing the semiconductor device shown in FIG. 1.

A first embodiment of the present invention will be described with reference to FIGS. 1 and 2. FIG. 1 shows a semiconductor device 100 that includes a field-stop-type (FS-type) IGBT having a trench gate structure. The semiconductor device 100 has an IGBT region and a guard ring region. The guard ring region is positioned to surround the IGBT region as shown in FIG. 2.

First, the IGBT region will be described. A substrate 101 made of an N-type (—N) semiconductor forming a drift layer has a first surface and a second surface. On the first surface, a base region 102 made of a P-type (P) semiconductor is formed in the IGBT region. Channels of the IGBT element are formed in the base region 102. Plural gate trenches 103 are discretely formed through the base region 102 to reach the substrate 101 (the drift layer). An insulating film is formed to cover all walls (a side wall and a bottom wall) of the gate trench 103, and the gate trench 103 is filled with a material such as polysilicon that forms a gate electrode 104. An emitter region (N+) 105 is formed between neighboring gate trenches 103, and the emitter region 105 is electrically connected to an emitter electrode 106 made of, e.g., aluminum.

The base region 102 is divided into plural regions 102a, 102b and 102c by the gate trenches 103. The region 102a, a smaller region between the neighboring gate trenches 103, is electrically connected to the emitter electrode 106 together with the emitter region 105 formed in the region 102a. That is, the emitter region 105 is a region where its potential is fixed. The groin 102b, a larger region between the neighboring gate trenches 103, is not connected to the emitter electrode 106. That is, the region 102b is a region where its potential is not fixed, i.e., a region where its potential is floating. By structuring the regions 102a-102c in this manner, carriers are effectively accumulated, and an ON-voltage of the substrate 101 functioning as a drift layer is lowered. The regions 102a and 102b are alternately formed on the first surface of the substrate 101. A region 102c, which is an outer peripheral region of the base region 102 (refer to FIG. 2), is electrically connected to the emitter electrode 106 although the emitter region 105 is not formed therein. The outer peripheral region 102c serves as a part of a region for collecting carriers of breakdown current.

A collector layer 107 made of a P-type semiconductor (P+) is formed on the second surface of the substrate 101. The collector layer 107 is electrically connected to a collector electrode 108 made of a material such as aluminum. A field-stop layer (FS layer) 109 is formed between the collector layer 107 and the substrate 101 functioning as the drift layer. The FS layer 109 is made of an N-type (N) semiconductor. When the IGBT element is formed as a FS-type IGBT having a trench structure as described above, the thickness of the semiconductor device 100 can be made thinner, compared with that of other types of IGBTs having a trench structure, such as a punch-through-type or a non-punch-through-type.

Now, the guard ring region formed to surround the IGBT region will be described. A guard ring 110 is formed on the first surface of the substrate 101, surrounding the base region 102. The guard ring 110 is made of a P-type (P) semiconductor and functions as an electric field concentration suppressing region. By forming the guard ring 110, a depletion layer formed by imposing a reverse bias to a PN-junction between the substrate 101 and the base region 102 spreads around the IGBT element, and therefore, an electric field concentration at the outer periphery of the IGBT region is suppressed.

In this particular embodiment, the base region 102 is surrounded by plural guard rings 110, and the depth of the guard rings 110 is made substantially equal to the depth of the base region 102. Of the plural guard rings, only the guard ring 110a positioned at an inner periphery of the guard ring region is electrically connected to the emitter electrode 106. The innermost guard ring 110a serves as the region for collecting the carriers of the breakdown current. The guard rings 110 other than the guard ring 110a are electrically floating.

A dummy trench (serving as a low breakdown voltage region) 111 is formed between the IGBT region and the guard ring region. The dummy trench 111 formed between the carrier collecting regions 110a and 102c has a breakdown voltage lower than that of the IGBT element. In this particular embodiment, the dummy trench 111 is formed in the same depth as that of the gate trench 103. All the inner walls of the dummy trench 111 are covered with an insulating film, and the dummy trench 111 is filled with polysilicon. The polysilicon in the dummy trench 111 is not connected to the emitter electrode 106 and is electrically floating. The dummy trench 111 can be formed together with the gate trenches 103 at the same time.

Now, function of the dummy trench 111 will be explained. As shown in FIG. 1, no P-type region is formed on the substrate at a region between the innermost guard ring 110a and the outermost base region 102c. Therefore, an electric field concentration is higher at the dummy trench 111 than at the gate trenches 103. Since a breakdown voltage of the guard rings 110 is higher than that of the IGBT element, a breakdown voltage is the lowest at the dummy trench 111 in the semiconductor device 100. That is, a radius of curvature of equipotential lines shown with dotted lines in FIG. 1 becomes small at the dummy trench 111.

If the avalanche phenomenon occurs by biasing between the collector electrode 108 and the emitter electrode 106, the breakdown current concentrates to the dummy trench 111, and carriers (holes) are collected through the innermost guard ring 110a and the outermost base region 102c. In this manner, concentration of the breakdown current at the bottom walls of the gate trenches 103 is prevented. Thus, the IGBT element is protected from being broken down.

In this particular embodiment, the shape of the dummy trench 111 is made the same as that of the gate trenches 103 to simplify a process of forming the trenches. It is possible, however, to make the shape of the dummy trench 111 different from that of the gate trenches 103 as long as the breakdown voltage at the dummy trench 111 becomes lower than the breakdown voltage at the IGBT element. For example, the electric field concentration can be made higher by making the depth of the dummy trench 111 deeper. The electric field concentration at the dummy trench 111 can be made further higher by making a radius of curvature at a corner of the bottom wall of the dummy trench 111 smaller than that of the gate trenches 103. Thus, the breakdown voltage at the dummy trench 111 can be further lowered.

As shown in FIG. 2, one dummy trench 111 in a circular shape is formed in this particular embodiment. However, two or more dummy trenches 111 can be formed. Further, the shape of the dummy trench 111 is not limited to the circular shape. For example, the circular shape may be divided into plural portions by forming slits therein.

Figure 3:
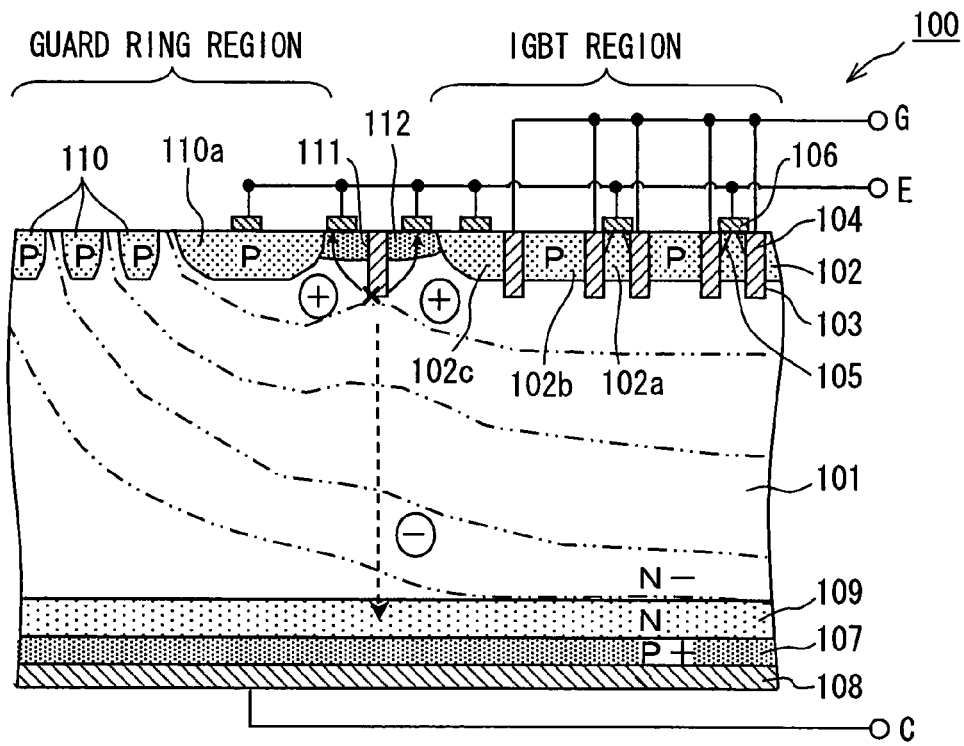
FIG. 3 is a cross-sectional view showing a semiconductor device having an IGBT as a second embodiment of the present invention.

A second embodiment of the present invention is shown in FIG. 3. In this embodiment, a pair of carrier collecting regions 112 made of a P-type semiconductor is additionally formed at both sides of the dummy trench 111. These carrier collecting regions 112 are made shallower than both of the innermost guard ring 110a and the outermost base region 102c, and are electrically connected to the emitter electrode 106. The dummy trench 111 is formed through the carrier collecting regions 112 to reach the substrate 101. Other structures of the second embodiment are the same as those of the first embodiment.

Though the electric field concentration at the dummy trench 111 is a little alleviated by additionally forming the carrier collecting regions 112 made of the P-type semiconductor, the electric field concentration at the dummy trench 111 is still higher than that of the IGBT element. A radius of curvature of the equipotential lines shown in FIG. 3 with dotted lines is smaller at the dummy trench 111 than at other places. Since the carrier collecting regions 112 are additionally formed in this embodiment, the carriers (holes) of the breakdown current are effectively collected (or taken out of the device). The breakdown at the bottom walls of the gate trenches 103 is similarly prevented in the second embodiment, too.

Figure 4:
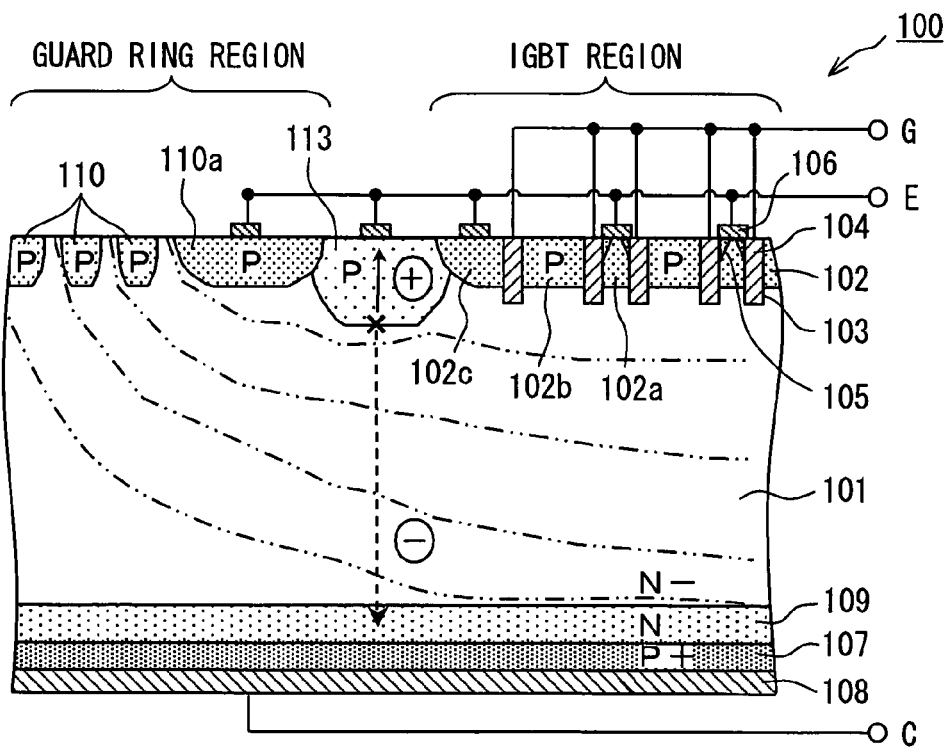
FIG. 4 is a cross-sectional view showing a semiconductor device having an IGBT as a third embodiment of the present invention.

A third embodiment of the present invention is shown in FIG. 4. In this embodiment, a well region 113 is formed in place of the dummy trench 111 formed in the foregoing embodiments. Other structures are the same as those of the first embodiment. The well region 113 is made of a P-type semiconductor and formed deeper than the innermost guard ring 110a and the base region 102.

By making the well region 113 deeper, a distance between the well region 113 and the field-stop layer 109 becomes shorter. Accordingly, a depletion layer spreading from a P-N junction formed between the substrate 101 and the base region 102 reaches the field-stop layer 109. This makes the electric field concentration at the well region 113 becomes higher, i.e., the breakdown voltage at the well region 113 becomes lower than the IGBT region. The carriers (holes) of the breakdown current can be effectively taken out through the well region 113. The concentration of the breakdown current at the corners of the bottom wall of the gate trenches 103 is effectively prevented, and breakdown of the IGBT element is prevented.

Figure 5:
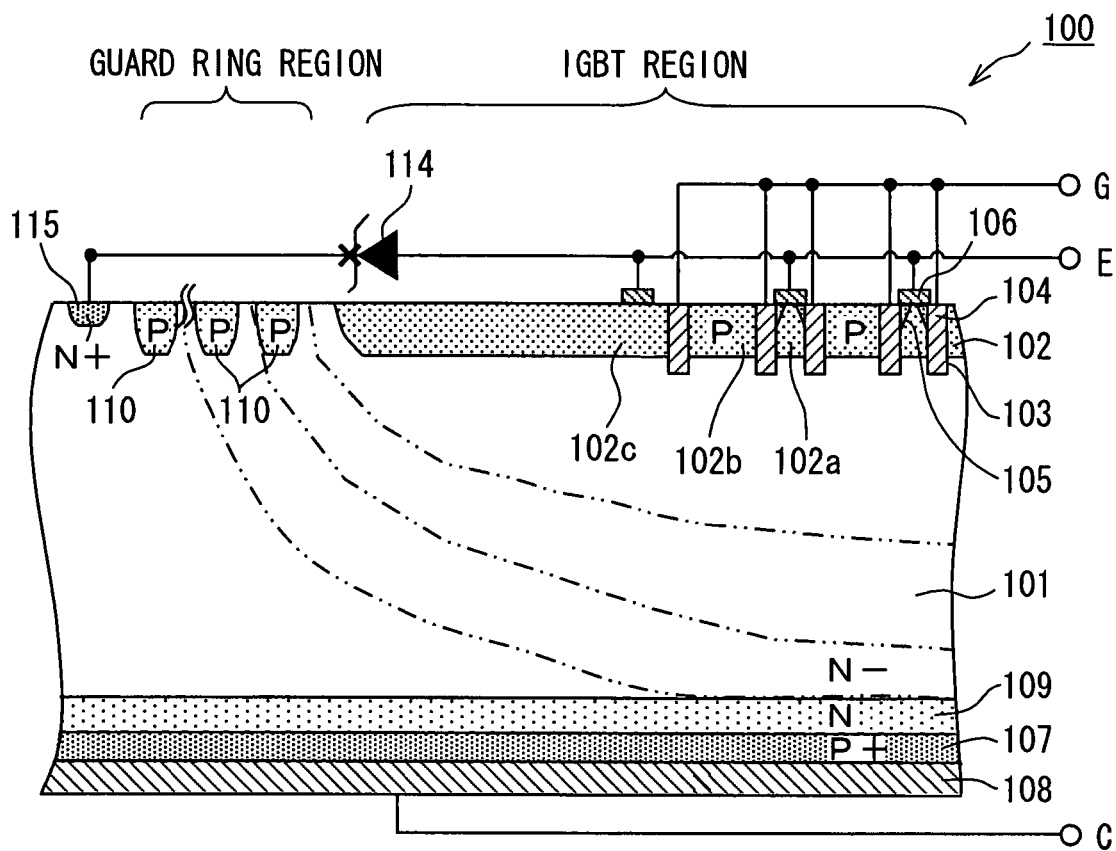
FIG. 5 is a cross-sectional view showing a semiconductor device having an IGBT as a fourth embodiment of the present invention.

A fourth embodiment of the present invention is shown in FIG. 5. In this embodiment, the outermost base region 102c is expanded while eliminating the dummy trench 111 and the innermost guard ring 110a. A Zener diode 114 having a breakdown voltage lower than that of the IGBT element is connected between the collector electrode 108 and the emitter electrode 106. A contact region 115 made of an N-type (N+) semiconductor is formed on the first surface of the substrate 101 and is electrically connected to a cathode of the Zener diode 114. Other structures are the same as those of the first embodiment. If the avalanche phenomenon occurs, the Zener diode 114 having the lower breakdown voltage breaks down first, and the IGBT element is protected from being broken down.

The Zener diode 114 in this particular embodiment is formed as part of wiring formed on the substrate 101, i.e., the IGBT element and the Zener diode 114 is integrated in one chip. It is possible, however, the Zener diode 114 may be separately made and electrically connected.

The present invention is not limited to the embodiments described above, but it may be variously modified. For example, though the IGBT element is formed as a field-stop-type element in the foregoing embodiments, it may be formed as an element having other trench structures such as a punch-through-type or a non-punch-through-type. The guard ring 110 may be eliminated as long as a portion having a breakdown voltage lower than that of the gate trenches 103 is formed to surround the IGBT region. The innermost guard ring 110a and the outermost base region 102c are formed as regions for collecting carriers (holes) in the foregoing embodiments. It is possible, however, to form a carrier collecting region, which is made of the same type of semiconductor as that of the base region and electrically connected to the emitter electrode 104, in addition to the innermost guard ring 110a and the outermost base region 102c. The N-type semiconductor may be denoted as a first type semiconductor and the P-type semiconductor as a second type semiconductor, and both types may be reversed in structuring the semiconductor device 100.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a substrate, made of a first type semiconductor, having a first surface and a second surface;
   a base region, made of a second type semiconductor, formed on the first surface of the substrate;
   gate trenches formed through the base region to reach the substrate;
   a gate electrode filling the gate trenches, inner walls of the gate trenches being covered with a gate insulating film;
   an emitter region, made of the second type semiconductor, formed between gate trenches; and
   an IGBT element including an emitter electrode connected to the emitter region, a collector layer, made of the second type semiconductor, formed on the second surface of the substrate, and a collector electrode connected to the collector layer; wherein:
   a low breakdown voltage region having a breakdown voltage, which is lower than a breakdown voltage of the IGBT element, is formed on the first surface of the substrate around the IGBT element
   a carrier collecting region, made of the second type semiconductor and electrically connected to the emitter electrode, is formed in the vicinity of the low breakdown voltage region;
   an electric field concentration suppressing region is formed on the first surface of the substrate around the base region such that the low breakdown voltage region is disposed between the electric field concentration suppressing region and a region where the IGBT element is formed; and
   a breakdown voltage of the electric field concentration suppressing region is higher than the breakdown voltage of the low breakdown voltage region and the breakdown voltage of the IGBT element.

2. The semiconductor device as in claim 1, wherein:
   a field-stop layer is formed between the substrate and the collector layer.

3. The semiconductor device as in claim 1, wherein:
   the electric field concentration suppressing region is a guard ring made of a second type semiconductor.

4. The semiconductor device as in claim 3, wherein:
   the low breakdown voltage region is a dummy trench formed between the base region and the guard ring to surround the base region and is electrically independent from the gate electrode; and
   at least either one of an inner peripheral portion of the guard ring or an outer peripheral portion of the base region functions as a carrier collecting region and is electrically connected to the emitter electrode.

5. The semiconductor device as in claim 4, wherein:
   the dummy trench is deeper than the gate trenches.

6. The semiconductor device as in claim 4, wherein:
   a radius of curvature at a bottom corner of the dummy trench is smaller than that of the gate trenches.

7. The semiconductor device as in claim 3, wherein:
   a carrier collecting region is formed between an inner peripheral portion of the guard ring and an outer peripheral portion of the base region; and
   the carrier collecting region being shallower than the guard ring and the base region, and electrically connected to the emitter electrode.

8. The semiconductor device as in claim 3, wherein:
   a carrier collecting region is formed between the guard ring and the base region; and
   the carrier collecting region being deeper than the guard ring and the base region, and electrically connected to the emitter electrode.

9. A semiconductor device comprising:
   a substrate, made of a first type semiconductor, having a first surface and a second surface;
   a base region, made of a second type semiconductor, formed on the first surface of the substrate;
   gate trenches formed through the base region to reach the substrate;
   a gate electrode filling the gate trenches, inner walls of the gate trenches being covered with a gate insulating film;
   an emitter region, made of the second type semiconductor, formed between gate trenches;
   an IGBT element including an emitter electrode connected to the emitter region, a collector layer, made of the second type semiconductor, formed on the second surface of the substrate, and a collector electrode connected to the collector layer; and a contact region, made of the first type semiconductor, formed on the first surface of the substrate on an outer side of the IGBT element, wherein:

a Zener diode, having a breakdown voltage lower than that of the IGBT element, is disposed between the collector electrode and the emitter electrode; and an anode of the Zener diode is electrically connected to the emitter electrode while a cathode of the Zener diode is electrically connected to the contact region.

10. The semiconductor device as in claim 9, wherein:
the Zener diode is formed as part of wiring formed on the substrate.

11. The semiconductor device as in claim 9, wherein:
a field-stop layer is formed between the substrate and the collector layer.

12. The semiconductor device as in claim 11, wherein:
an electric field concentration suppressing region is formed on the first surface of the substrate around the base region.

13. The semiconductor device as in claim 12, wherein:
the electric field concentration suppressing region is a guard ring made of a second type semiconductor.

14. The semiconductor device as in claim 1, wherein:
the first type semiconductor is an N-type semiconductor and the second type semiconductor is a P-type semiconductor.

* * * * *